United States Patent
Fertig et al.

(10) Patent No.: US 9,219,177 B2
(45) Date of Patent: Dec. 22, 2015

(54) PHOTO DETECTOR AND INTEGRATED CIRCUIT

(75) Inventors: Matthias Fertig, Konz (GE); Nikolaj Moll, Zurich (CH); Thomas Morf, Gross (CH); Thomas Pflueger, Leinfelden (GE)

(73) Assignee: International Business Machines Corporation, Armonk, NY (US)

( * ) Notice: Subject to any disclaimer, the term of this patent is extended or adjusted under 35 U.S.C. 154(b) by 320 days.

(21) Appl. No.: 13/639,782

(22) PCT Filed: Mar. 25, 2011

(86) PCT No.: PCT/EP2011/054599
§ 371 (c)(1),
(2), (4) Date: Dec. 4, 2012

(87) PCT Pub. No.: WO2011/124481
PCT Pub. Date: Oct. 13, 2011

(65) Prior Publication Data
US 2013/0093035 A1    Apr. 18, 2013

(30) Foreign Application Priority Data

Apr. 7, 2010 (EP) .................................. 10159256

(51) Int. Cl.
*H01L 31/0232* (2014.01)
*G02B 6/124* (2006.01)
(Continued)

(52) U.S. Cl.
CPC .......... *H01L 31/02327* (2013.01); *G02B 6/124* (2013.01); *H01L 27/14625* (2013.01);
(Continued)

(58) Field of Classification Search
CPC ............ H01L 31/0232; H01L 27/1446; H01L 27/14625; H01L 27/14681; H01L 31/02327; H01L 31/1105; H01L 31/1136; H01L 31/02019
USPC ........................................... 257/432, E31.001
See application file for complete search history.

(56) References Cited

U.S. PATENT DOCUMENTS 3,704,377 A    11/1972  Lehovec
4,660,062 A *   4/1987  Nishizawa et al. ........... 257/345
(Continued)

FOREIGN PATENT DOCUMENTS

JP          61097606 A      5/1986
WO       2007082952 A1     7/2007

OTHER PUBLICATIONS

Ikeda et al., "Wavelength Identification Sensor Using MOS Photo-Transistor Array Based on Metal Slit Diffraction", 1st International Conference on Sensing Technology, Palmerston North, New Zealand, Nov. 21-23, 2005.
(Continued)

*Primary Examiner* — Selim Ahmed
(74) *Attorney, Agent, or Firm* — Russell Ng PLLC; Steven Bennett (57) ABSTRACT

The photo detector (100, 300, 500, 600, 700, 900) comprises a photo transistor (102, 902). The photo transistor has a light sensitive region (112, 910) for controlling the transistor action of the photo transistor. The photo detector further comprises a dielectric layer (118). The dielectric layer is in contact with the photo transistor. The photo detector further comprises a grating pattern (114, 604, 914, 1010) in contact with the dielectric layer. The grating layer and the dielectric layer are adapted for focusing electromagnetic radiation in the light sensitive region.

26 Claims, 8 Drawing Sheets (51) Int. Cl.
H01L 27/146 (2006.01)
H01L 31/02 (2006.01)
H01L 31/11 (2006.01)
H01L 31/113 (2006.01)

(52) U.S. Cl.
CPC .... *H01L27/14681* (2013.01); *H01L 31/02019* (2013.01); *H01L 31/0232* (2013.01); *H01L 31/1105* (2013.01); *H01L 31/1136* (2013.01)

(56) References Cited

U.S. PATENT DOCUMENTS

| | | | |
|---|---|---|---|
| 4,994,664 | A | 2/1991 | Veldkamp |
| 6,043,508 | A | 3/2000 | Oikari et al. |
| 6,075,908 | A | 6/2000 | Paniccia et al. |
| 7,929,814 | B2 | 4/2011 | Gothoskar et al. |
| 2003/0118306 | A1 | 6/2003 | Deliwala |
| 2005/0029643 | A1* | 2/2005 | Koyanagi ............... 257/680 |
| 2009/0140362 | A1* | 6/2009 | Fertig et al. ............ 257/432 |
| 2009/0179225 | A1 | 7/2009 | Fertig et al. |

OTHER PUBLICATIONS

E. Culurciello, "Three-dimensional phototransistors in 3D silicon-on-insulator technology", Electronics Letters, vol. 43 No. 7, Mar. 29, 2007.

Matsumoto et al., "The Operation Mechanism of a Charge Modulation Device (CMD) Image Sensor", IEEE Transactions on Electron Devices. vol. 38. No., May 5, 1991.

Werner et al., "Light Dependence of Partially Depleted SOI-MOSFET' s Using SIMOX Substrates", IEEE Transactions on Electron Devices, vol. 42, No., Sep. 9, 1995.

Wittmer et al., "The Infrared Sensing MOSFET", Authorized licensed use limited to: KnowledgeGate from IBM Market Insights. Downloaded on Oct. 19, 2009 from EEE Xplore.

Fertig et al., "Grating enhanced photo transistor", Oct. 2009.

Forbes et al., Design for Silicon Infrared Sensing MOSFET, IEEE Transactions on Electron Devices, vol. ED-21, No. 8, Aug. 1974.

Ng, Kwok K., "Complete Guide to Semiconductor Devices", McGraw-Hill Series in Electrical and Computer Engineering, pp. 437-440, Jul. 25, 2002.

Schanz et al., "CMOS Photosensor Arrays With On-Chip Signal Processing", pp. 236-239, Sep. 16-18, 1997.

Forbes et al., "Characteristics of the Indium-Doped Infrared Sensing MOSFET( IRFET)", IEEE Transactions on Electron Devices, vol. ED-23, No. 12, Dec. 1976.

Panasonic Electric Works, "HS PhotoMOS (AQV234)—Highest sensitivity LED operate current: typical 0.31A" http://pewa.panasonic.com/assets/pcsd/catalog/aqv-dip-low-power-consumption-catalog.pdf.

Matsumoto et al., "Analysis of Operational Speed and Scaling Down the Pixel Size of a Charge Modulation Device (CMD) Image Sensor", IEEE Transactions on Electron Devices. vol. 38, No. May 5, 1991.

International Application No. PCT/EP2011/054599, International Search Report and Written Opinion dated Mar. 5, 2012.

Hisao Kikuta et al., "Optical Elements with Subwavelength Structured Surfaces", Optical Review, Springer, Berlin, DE, vol. 10, No. 2, pp. 63-73, Mar. 1, 2003.

Romain Quidant et al., "Sub-wavelength patterning of the optical near-field", Optical Express, vol. 12, No. 2, pp. 282-287, Jan. 26, 2004.

* cited by examiner

PHOTO DETECTOR AND INTEGRATED CIRCUIT

FIELD OF THE INVENTION

The invention relates to photo detectors comprising a photo transistor, in particular photo detectors with a grating pattern for focusing electromagnetic radiation in a light sensitive region of the photo transistor.

BACKGROUND

Photo transistors may be used for the detection of light or light signals. Silicon On Insulator (SOI) technologies utilize very small layers to form metal oxide semiconductor transistors in a complementary switching scheme to build digital CMOS circuitry. The use of optical interconnects becomes more and more interesting as the integration density increases and the required bandwidth can no longer be provided by the electrical solutions.

In order for a photo transistor to function properly, the light incident on the photo transistor must have a sufficiently large intensity to generate the specific charge density (charge/volume) needed to switch the transistor.

SUMMARY OF THE INVENTION

The invention provides for a photo detector and an integrated circuit in the independent claims. Embodiments are given in the dependent claims.

At reduced light levels or by using thin layers for the absorption of light, the incident light may not generate a specific charge density which is large enough to allow the photo transistor to function. Embodiments of the invention may solve this problem by using a diffraction pattern or grating that concentrates electromagnetic radiation in the light sensitive area of the photo transistor. This makes the photo transistor more sensitive to light and operable with thin layers as they appear, for example, in a CMOS SOI technology.

Embodiments of the invention may have the following advantages:

A standard transistor using standard process flows is used to fabricate the photo transistors used to build the basis for an optical transistor. All future generations of the semiconductor technology will use transistor structures, and therefore no dedicated optimization needs to be performed to make the transistor operable from an electrical point of view.

The optical transistor is enhanced by a grating that concentrates optical energy in the channel and the generated electrons are used to switch the transistor. With upcoming generations in the technology, a potential reduction of the channel length of transistors supports the use of gratings, because the channel is then completely covered by the concentrated irradiance and this better supports a smooth enrichment of charges such that the depletion/inversion layer is formed.

For field effect transistors, it is not the photo-current that makes the device operable but the light is used to form a conductive channel (i.e., depletion region) underneath the grating to switch the transistor.

No process modifications are required to manufacture the devices.

The gate voltage in field effect transistors can be used to BIAS the gate region and make it more or less sensitive to incident light.

A substrate voltage in field effect transistors can be used to BIAS the gate region and support the removal of charges in order to reset the device.

A "photo transistor" as used herein refers to a transistor which has a light sensitive region which, when exposed to light, may control or affect the transistor action of the photo transistor. Different types of transistors may be photo transistors, for instance a photo transistor may be a field effect transistor or it may be a bipolar transistor.

A "grating pattern" as used herein is a pattern or arrangement of geometric structures which functions as a diffraction grating. A grating pattern may be made of a dielectric material or a conductor. A grating pattern may also be partially made of a dielectric material and a conductor. For instance there may be a structured dielectric layer in one level of the integrated circuit and there may be a conductive pattern above or below the dielectric pattern.

A "sub-wavelength grating" as used herein is a grating pattern which has a spacing between structures that is smaller than the wavelength. A characteristic spacing between structures in the sub-wavelength grating is less than the wavelength of the light being diffracted by the sub-wavelength grating.

A "light guide" as used herein is a structure which is able to guide incident light along a path followed by the light guide. Light guides may be typically manufactured by having a material with an index of refraction of two. Typically a higher index of refraction material is surrounded by a lower index of refraction material. The boundary between the two dielectric materials is a surface which reflects light along the path of the light guide.

A field effect transistor has a gate, a drain, and a source. A "gate region" as used herein is the region of the field effect transistor in contact with the gate electrode of the field effect transistor.

A bipolar photo transistor has an emitter base and collector. There is a PN junction between the collector and base regions of the photo transistor. The PN junction between the collector and base is the light sensitive region of a bipolar photo transistor.

Integrated circuits are miniaturized electronic circuits that have been manufactured in or on the surface of a thin layer or substrate. The amount of circuitry on an integrated circuit may be increased by stacking layers or levels of integrated circuits on top of each other. This is performed by manufacturing a level or layer of circuitry and then manufacturing another level of circuitry on top of the first level.

The invention provides for a photo detector comprising a photo transistor. The photo transistor has a light sensitive region for controlling the transistor action of the photo transistor. The photo detector further comprises a dielectric layer. The dielectric layer is in contact with the photo transistor. The entire surface of the photo transistor need not be in contact with the dielectric layer. The photo detector further comprises a grating pattern in contact with the dielectric layer. The grating layer and the dielectric layer are adapted for focusing electromagnetic radiation in the light sensitive region. This is advantageous because the light is essentially concentrated in the light sensitive region. This means that the photo detector will therefore be more sensitive to light than if the grating pattern were not there. The dielectric layer may be a collection of dielectric layers which allow light a path to reach the photo transistor.

In different embodiments the grating pattern can be manufactured in different ways. In some embodiments the dielectric layer and the grating pattern are both dielectrics. Due to the different dielectric properties the combination of the dielectric layer and the grating pattern diffract the light into the light sensitive region of the photo transistor. In some embodiments the dielectric layer may be in contact with the photo transistor and the grating pattern may be in contact with the dielectric layer but not the photo transistor. For instance the photo transistor may be covered with the dielectric with the grating pattern on top of the dielectric layer. In other embodiments the grating pattern may comprise at least a portion of the photo transistor. For instance electrical connections or other structures in the photo transistor may serve as a portion of the grating pattern.

In another embodiment the grating pattern forms a sub-wavelength grating. Electromagnetic radiation is focused in the light sensitive region by standing electromagnetic waves caused by the sub-wavelength grating. This embodiment is particularly advantageous. In an effort to increase the performance of integrated circuits the feature size of devices such as photo transistors is constantly being decreased. A difficulty is that when the feature size is less than the wavelength of light which is sought to be detected it is difficult to focus the light into the light sensitive region. In such a case, the maximum of irradiance need to be aligned to the gate region which has sub-wavelength dimensions and may be positioned at sub-wavelength distances. By using a sub-wavelength grating structures with characteristic separations or lengths smaller than the wavelength of the light to be detected, a concentration of electromagnetic radiation in the light sensitive region is achieved. This means that decreasing feature size can be compensated for by using a sub-wavelength grating.

In another embodiment the photo detector further comprises a light guide. The grating pattern and the dielectric layer are adapted for focusing electromagnetic radiation transmitted by the light guide in the light sensitive region. In some embodiments a portion of the light guide may form a portion of the grating pattern or the dielectric layer. This embodiment is advantageous because a photo detector according to an embodiment of the invention may be used for use in optical communications. For instance optical communication could be established between different portions of a same integrated circuit or optical communications between discreet devices could be performed using an embodiment of the invention.

In another embodiment the photo detector further comprises a substrate. In some embodiments the substrate may be a buried insulator such as a buried oxide (BOX) layer. The substrate may for example be a thin film or layer of deposited semiconductor. In still other embodiments the substrate is a buried oxide layer fabricated on a semiconductor substrate. The semiconductor may be for example, but is not limited to, silicon. The photo transistor comprises a silicon channel. A silicon channel is a deposited layer of silicon. A device such as a photo transistor may be fabricated in the silicon channel. The silicon channel may be fabricated on the substrate. The silicon channel has a first dielectric constant. The substrate has second dielectric constant. The second dielectric constant is less than the first dielectric constant. This embodiment is advantageous because the interface between the silicon channel and the buried oxide layer may be reflective due to the difference in the dielectric constant. This embodiment may be advantageous because it may further concentrate electromagnetic radiation within the light sensitive region for instance if the photo transistor is fabricated in a silicon channel resting or adjacent to the buried insulator light may be reflected back into the photo transistor by the interface between the silicon channel and the buried insulator.

In another embodiment, the dielectric layer is between the photo transistor and the grating pattern. In this embodiment, the dielectric separates the grating pattern from the photo transistor.

In another embodiment the dielectric layer has a third dielectric constant. The grating pattern comprises a dielectric with a fourth dielectric constant. The third dielectric constant is different from the fourth dielectric constant. The difference between the third and the fourth dielectric constants allows a combination of the grating pattern and the dielectric layer to function as a diffraction grating.

In another embodiment the grating pattern comprises metal. This embodiment is advantageous because a regular pattern or network of structures may function as a diffraction grating.

In another embodiment the photo transistor is a field effect transistor. The photo transistor has a gate region. The gate region is the light sensitive region of the photo transistor. This embodiment is advantageous because a transparent electrical connection may be made to the gate region. For this reason highly efficient field effect transistors may be constructed.

In another embodiment the gate region has an electrode. The grating pattern forms at least a portion of the electrode. This embodiment is particularly advantageous because a collection of photo detectors may be arranged in a periodic or semi-periodic arrangement. In this case a portion of the electrode is used to form the grating pattern. This reduces manufacturing steps and costs by using the electrode to form the grating pattern.

In another embodiment the gate region comprises discrete multiple gate regions. The photo transistor comprises a source region comprising discrete multiple source regions. The photo transistor comprises a drain region comprising discreet multiple drain regions. The multiple gate regions, the multiple source regions, and the multiple drain regions are arranged in a comb-like structure. This embodiment is advantageous because use of discreet multiple gate regions increases the area from which light is gathered. By dividing the gate region into discreet multiple regions the diffraction grating can be used to focus the light only or concentrate it on the gate regions. If a single large gate region were used it would not necessarily be possible to focus the light in an efficient manner on the gate region. In this embodiment the structure or the device contributes to the grating pattern. In the same respect the gate regions are only located where the electromagnetic radiation is concentrated. This leads to a much more highly efficient photo detector.

In another embodiment the field effect transistor comprises an electrical connection for applying a bias to the gate region. This embodiment is advantageous because a voltage applied to the electrical connection may be controlled as a function of time in order to control the sensitivity and/or the removal of holes which are also positive charges from the gate region. Removal of holes from the gate region provides for a photo detector which responds more rapidly to changes in light.

In another embodiment the photo transistor is a bipolar photo transistor. The photo transistor has a PN junction between a collector and a base of the photo transistor. The PN junction is the light sensitive region of the photo transistor. This embodiment is advantageous because photo detectors according to an embodiment of the invention may also be constructed using a bipolar photo transistor.

In another aspect the invention provides for an integrated circuit comprising a plurality of photo detectors according to any one of the preceding claims. This embodiment is advantageous because such an integrated circuit may be used for the detection of light using multiple photo detectors. For instance such an integrated circuit could be used for optical communications or for the detection and/or polarization of incident light.

In another embodiment the photo detector comprises a field effect transistor with an electrical connection for applying a bias to the gate region (i.e., the bottom region of the gate channel, body-contacted FET). The integrated circuit comprises a bias generating circuit connected to the electrical connection of the plurality of photo detectors. The bias generating circuit is adapted for generating a bias for removal of optically generated charge carriers in the gate region. This embodiment is advantageous because such an integrated circuit will recover more rapidly once the integrated circuit is no longer exposed to light. This is because the lifetime of the charges and/or holes has been decreased.

The Bulk-BIAS may be attached to a body contact. In case of a standard CMOS SOI technology, the body contact can be attached from the side of the transistor and contacts the bottom region of the transistor channel. A Bulk-BIAS voltage speeds up the removal of charges which have been generated from incident light. The reset of the device after it has been exposed to light may then be faster.

The gate contact on the top of the transistor which is used to switch the transistor in the classic scheme and to make the photo-transistor more sensitive in this application (i.e., Gate-BIAS) can also be used to push charges away from the gate contact, if the applied voltage is reversed (i.e., the polarity is switched). Thereby, a reverse Gate-BIAS may support the removal of charges.

In another embodiment the integrated circuit has levels. The plurality of photo detectors is located in a first level. Light reaching the gate regions passes through a second level. The second level comprises electrical circuitry. The electrical circuitry forms at least a portion of the grating pattern. This is advantageous because structures used for manufacturing the electrical circuitry serve a dual purpose; they function as was mentioned before as electrical circuitry and also form part of the grating pattern.

In another embodiment the plurality of photo detectors are adapted for optical communications with another integrated circuit. For instance the integrated circuit could comprise an attachment for a fiber optic connection.

In another embodiment the plurality of photo detectors are adapted for optical communications within the integrated circuit. A light guide could be used for communicating optical signals between one location of an integrated circuit with another location of the integrated circuit.

In another embodiment the plurality of photo detectors are adapted for the detection of the polarization of incident light. The detection of polarization of incident light may be achieved by having a suitably arranged diffraction grating.

In another embodiment the plurality of photo detectors are adapted for functioning as a spectrometer. The grating pattern of an individual photo detector may be designed to detect light of a particular wavelength range. By having multiple photo detectors with slightly different grating patterns a spectrometer may be constructed.

In another embodiment the plurality of photo detectors are adapted for use as a photo detector with a small-band filter. As was mentioned before the diffraction grating may be constructed such that it detects light of a narrow wavelength band. The plurality of photo detectors may therefore be used as a photo detector with a small-band filter.

In another embodiment the plurality of photo detectors may be used for the wavelength dependent detection of incident light. This may be achieved by using a suitable grating pattern.

In another embodiment the plurality of photo detectors may be adapted for polarization dependent detection of incident light and the design of the grating pattern may be designed such that the electromagnetic radiation with a particular polarization is concentrated in the light sensitive region.

BRIEF DESCRIPTION OF THE DRAWINGS

In the following, preferred embodiments of the invention will be described in greater detail by way of example only making reference to the drawings in which.

DETAILED DESCRIPTION

In the following, like numbered elements in these figures are either similar elements or perform an equivalent function. Elements which have been discussed previously will not necessarily be discussed in later figures if the function is equivalent.

Figure 1:
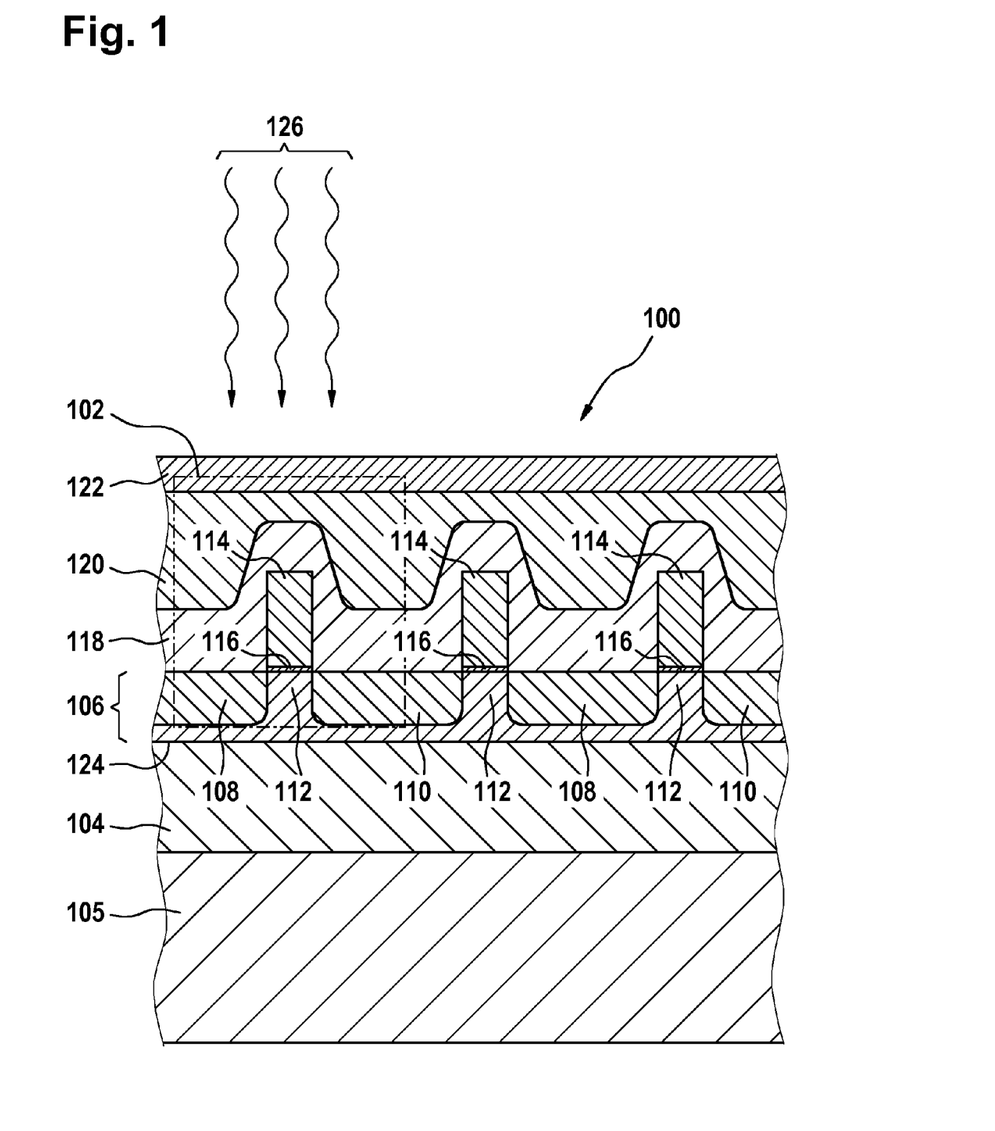
FIG. 1 illustrates a photo detector according to an embodiment of the invention.

FIG. 1 shows a photo detector 100 according to an embodiment of the invention. The dashed line marked 102 indicates a region of the photo detector 100 which contains a field effect transistor 102. The field effect transistor 102 is built upon a buried insulator layer 104. The buried insulator layer 104 may for instance be buried oxide or constructed using silicon on insulator construction. The buried insulator layer is on top of a semiconductor substrate 105. On top of the buried oxide layer 104 is a silicon channel 106. The silicon channel 106 has a first well 108 and a second well 110.

There is a gate region 112 between the first well 108 and the second well 110. If the field effect transistor 102 is a P-FET then the first well 108 and the second well 110 will be high P-doped wells made of monocrystalline silicon and the gate region will be low N-doped. If the FET transistor is an N-FET then the first well 108 and the second well 110 will be N-doped regions. For an N-FET the gate region will be P-doped. The first well 108 may be either the source or the drain of the field effect transistor. The second well 110 is also either the source of the drain whichever the first well 108 is not. Above the gate region 112 is a gate contact 114 which is a conductive material.

For the field effect transistor 102 to function as a photo transistor the gate contact 114 must be optically transparent. For instance, polycrystalline silicon may be used to fabricate the gate contract. Between the gate contact and the gate region 112 there may be an oxide layer 116 or other insulating layer for providing electrical insulation.

In this embodiment the gate contact 114 functions as the grating pattern. Covering the grating pattern 114 and the remainder of the field effect transistor 102 is a dielectric layer 118. The dielectric layer may be for instance made out of silicon nitride. The difference in the index of refraction between the dielectric layer 118 and the gate contact 114 causes the combination of the gate contact 114 and the dielectric layer 118 to function as a diffraction grating which concentrates electromagnetic radiation in the gate region 112.

Above the dielectric layer 118 is a filler layer 120. This may for instance be another dielectric layer. Above the filler layer 120 is an optional anti-reflective layer 122. Between the buried insulator 104 and the silicon channel 106 is an interface 124. If the index of refraction of the buried insulator 104 is smaller than the index of refraction of the silicon channel 106 then light 126 entering through the anti-reflective layer 122 towards the gate region 112 may be reflected back into the gate region 112 by the interface 124 if the light strikes the interface at an angle smaller than the critical angle.

In one implementation of the embodiment shown in FIG. 1 the buried insulator 104 or insulator may be approximately 145 nm thick. The silicon channel may be between 70 and 90 nm thick. The width of the first and second wells 108, 110 may be approximately 190 nm. The width of the gate contact 114 may be approximately 45 nm wide. The height of the gate contact 114 may be approximately 120 nm. The thickness of the silicon nitride layer may be approximately 70 nm. The thickness of the filler layer 128 may be approximately 53 nm, and the thickness of the anti-reflective layer 122 may be approximately 13 nm depending upon the film used and the wavelength of the light that the film is designed for.

Figure 2:
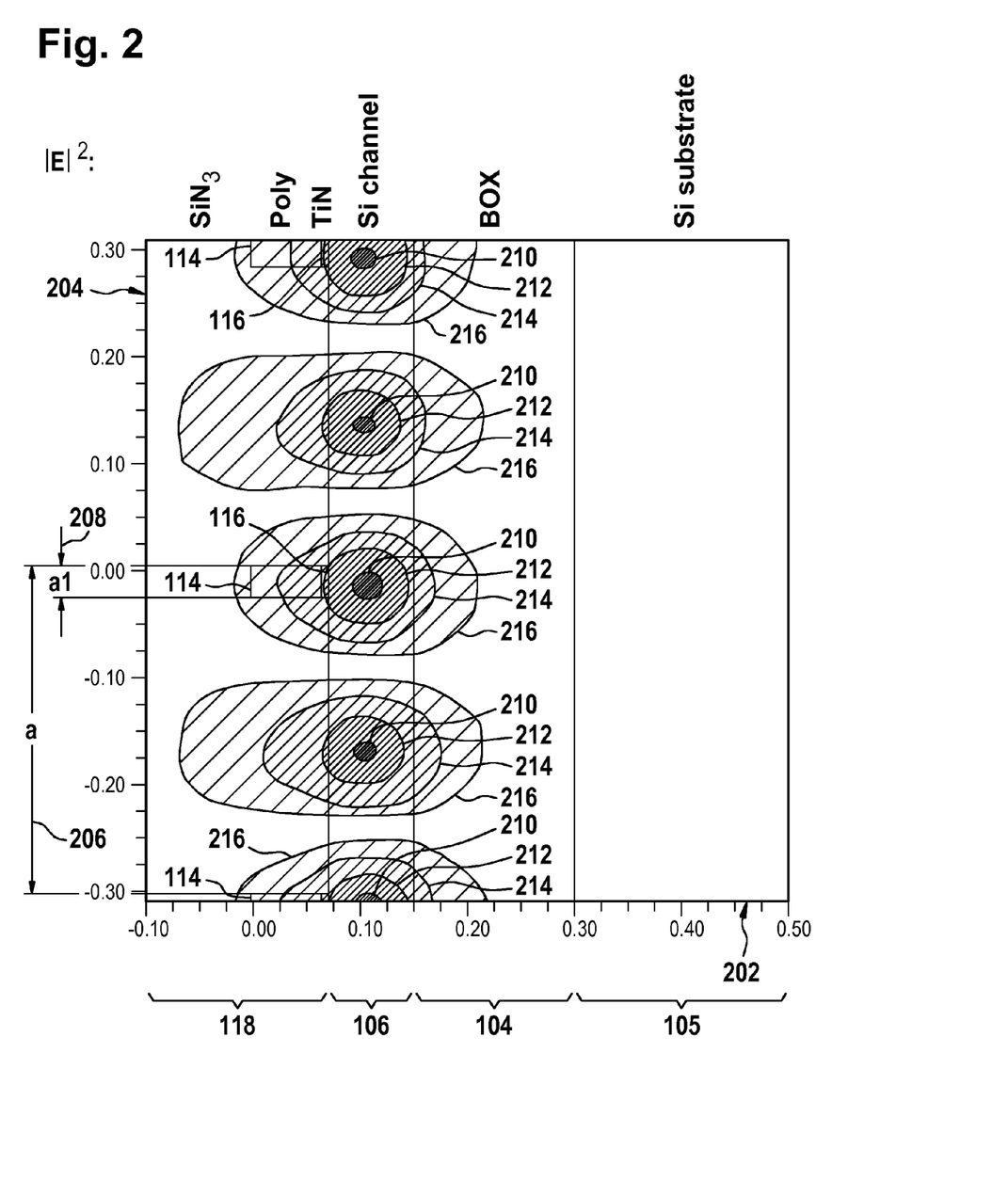
FIG. 2 shows rigorous coupled wave analysis (RCWA) simulation results of the electric field for a photo detector according to an embodiment of the invention.

FIG. 2 shows a simulation where the irradiance for a photo detector similar to that shown in FIG. 1 has been calculated using a rigorous coupled wave analysis (RCWA) model. The figure shows the squared amplitude of the electric field in a one dimensional or two dimensional grating for an exemplary wavelength of 850 nm. The device is shown as being constructed on a silicon substrate 105. The x-axis 202 is given in micrometers; the y-axis 204 is also given in micrometers. The view of FIG. 2 is rotated 90 degrees with respect to the view shown in FIG. 1. In this example titanium nitride forms the insulation layer 116 between the gate contact 114 and the gate region. The irradiance is shown using contour lines. Contour lines labeled 210 have squared electric field amplitude of 6.5 volts squared per micrometer squared, contour line 212 has an value of 5.17 volts squared per micrometer squared, contour line 214 has a value of 3.45 volts squared per micrometer squared, and contour line 216 has a value of 1.73 volts squared per micrometer squared. In this figure, we can see that the regions with the higher field strength 210 are situated within the gate region which is beneath the gate contact 114.

The distance a1 208 describes the grating width and a 206 is the grating pitch. This defines a duty cycle of the grating.

The grating may be made of polysilicon (Poly) in a CMOS SOI process and the channel of the transistor is formed underneath the Poly. The P and N regions to both sides of the channel form the Source and Drain structures. The entire structure of the transistor may be identical to what is used in standard CMOS, but the dimensions are determined by the grating that is required to concentrate light in the region underneath the Poly (i.e., the gate-region, the channel of the transistor).

Figure 3:
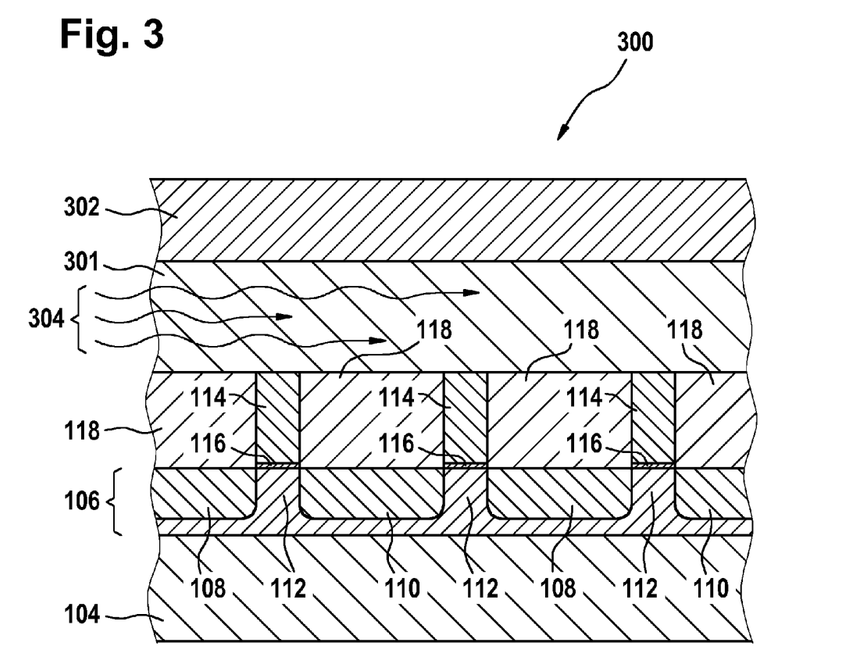
FIG. 3 illustrates a further embodiment of a photo detector according to an embodiment of the invention.

FIG. 3 shows a cross-sectional diagram which illustrates a further embodiment of a photo detector 300 according to an embodiment of the invention. The structure shown in FIG. 3 is similar to that shown in FIG. 1. The dielectric layer 118 and the gate contact 114 are in contact with a light guide 301. The light guide 301 is surrounded by the dielectric layer 118 and also another dielectric layer 302 which is positioned above it. As long as the dielectric constant of the light guide 301 is larger than the dielectric layer 302 and 118, then the layer 301 will function as a light guide. Light 304 is shown as propagating through the light guide 301. Such a light guide 304 could be used for receiving light signals from another portion of an integrated circuit or from an external connector such as a connection for a fiber optic connection. The spacing between the gate contact 114 can be designed such that the light 304 concentrates electromagnetic radiation in the gate region 112.

Figure 4:
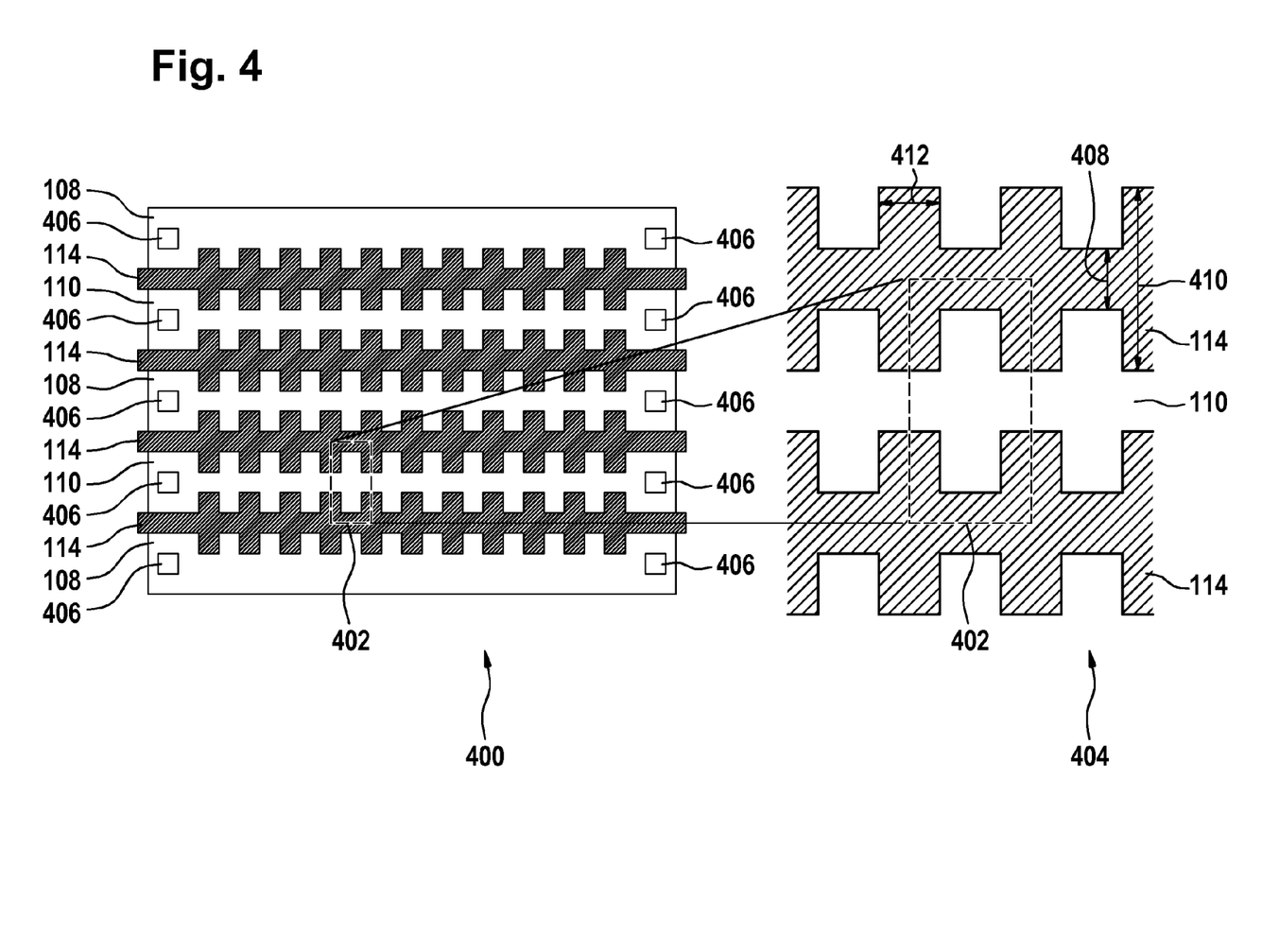
FIG. 4 shows a top of a photo detector according to an embodiment of the invention which has a two-dimensional grating pattern.

FIG. 4 shows a top view 400 of a photo detector where the gate contact 114 is shaped into a two-dimensional grating pattern. There is a selected region 402 which is indicated by a dashed line. This selected region 402 is magnified in the enlarged view 404. The first well 108 and second wells 110 both have electrical connections 406. The two-dimensional grating pattern shown in FIG. 4 is capable of detecting S and P type polarization. The use of a two-dimensional grating may also increase the amount of light concentrated in the gate region of the field effect transistor. This two-dimensional grating pattern has teeth on the gate contact 114. The width of the gate contact 114 is specified by the dimension 408. The width of the teeth is specified by the dimension 412. The length of the tooth is specified by the dimension 410. If the tooth width 412 is zero or there are no teeth then the grating pattern is a one-dimensional grating pattern. The grating pattern would then be a series of parallel ridges.

Figure 5:
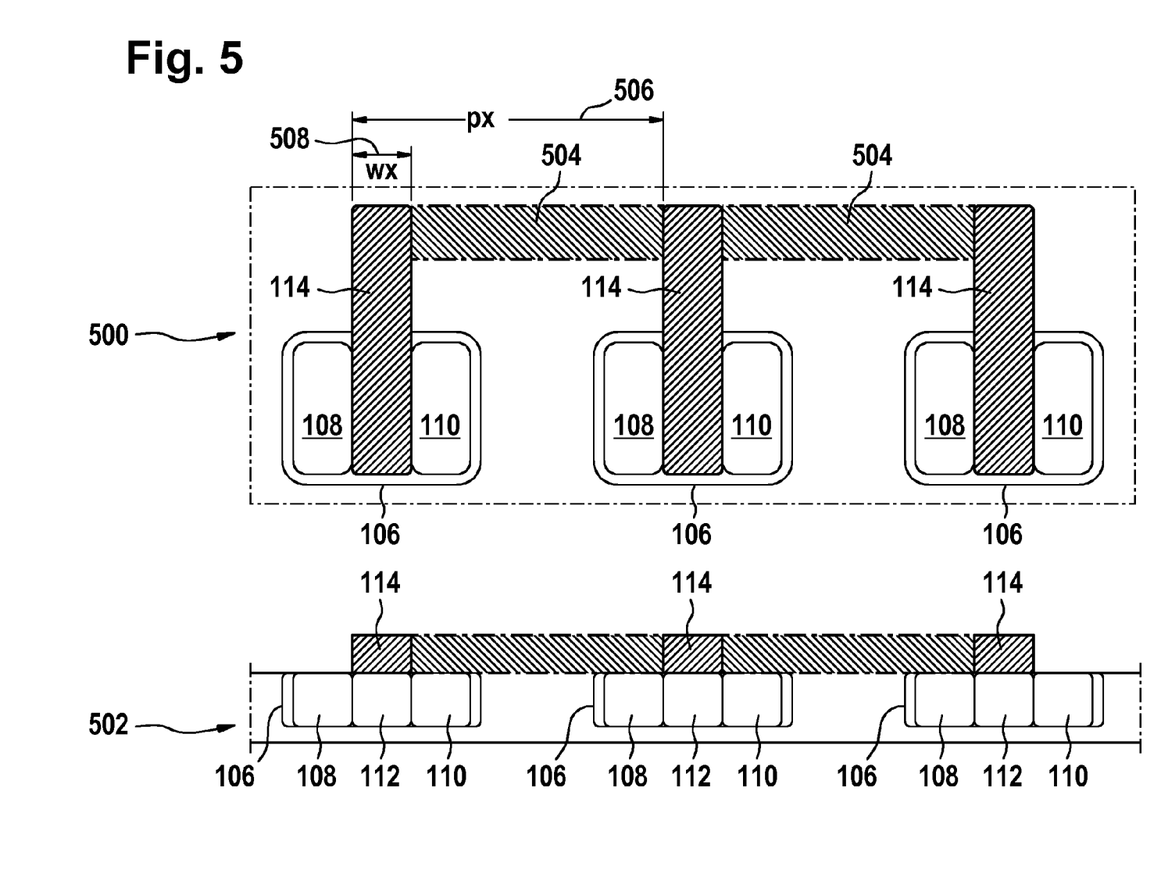
FIG. 5 shows a further embodiment of a photo detector according to an embodiment of the invention.

FIG. 5 shows a top 500 and a cross-sectional 502 view of a multi-finger field effect transistor. In this example the transistor has multiple gate drain and source regions that are not connected. The example shown in FIG. 5 has a one-dimensional grating pattern. In this example the gate contacts 114 form the grating pattern. The electrical connections between the gate contacts 114 is labeled 504. The spacing between gate contacts 114 is labeled 506 and px, and the width of the gate contacts is labeled 508 and wx, where wx and px are design parameters for a one-dimensional grating pattern.

Figure 6:
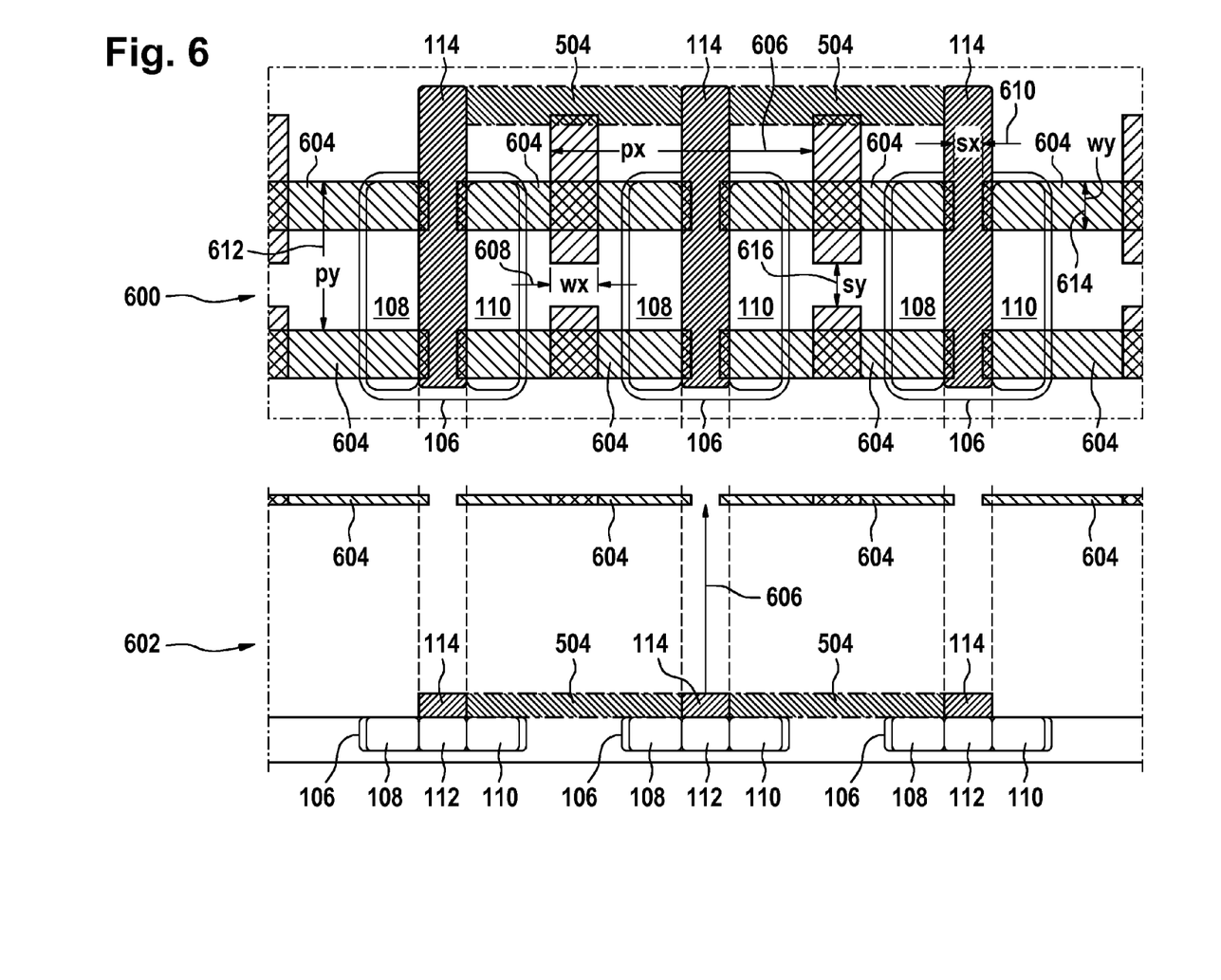
FIG. 6 shows a further embodiment of a photo detector according to an embodiment of the invention.

FIG. 6 is similar to that of FIG. 5 but in FIG. 6 a two-dimensional grating pattern is illustrated. FIG. 6 shows a top 600 and a cross-sectional 602 view of a photo detector according to an embodiment of the invention. In this example the grating pattern 604 is formed by a thin film layer which is displaced a distance 606 away from the gate contact 114. The space which can fill the distance 606 may, for example, be a dielectric layer. The grating pattern 604 may also be in a separate level of the integrated circuit. For instance the grating pattern 604 may not be a regular pattern as illustrated in FIG. 6, but may be in fact electrical contact for circuitry located above the layer in which the photo detector is located. The transistors in FIGS. 5 and 6 are arranged in a comb-like structure.

As in FIG. 5, the electrical connection between the gate contacts 114 in FIG. 5 is labeled 504. The distance between grating pattern elements 604 is labeled 606 and px. The distance px 606 is taken to be in the "x" direction. Perpendicular to the "x" direction is the "y" direction. The gate contacts 114 are rectangular shaped. In this embodiment, the longer dimension of the gate contacts 114 is taken to be the "y" direction.

The grating pattern 604 in FIG. 6 is cross shaped, with the cross being aligned with the "x" and "y" directions. The width of the grating pattern in the "x" direction is labeled 608 and wx. The spacing between adjacent elements of the grating pattern 604 is labeled 610 and sx. The spacing between adjacent elements of the grating pattern 604 in the "y" direction is labeled 612 and py. The width of the grating pattern elements in the "y" direction is labeled 614 and wy. The spacing between adjacent elements of the grating pattern 604 in the "y" direction is labeled 616 and sy. Design parameters wx, px, sx, wy, py, and sy are for a two-dimensional grating pattern.

Using the xy, py, sx, wy, py, and sy as defined in FIGS. 5 and 6, an algorithm, written in pseudo code, which may be used to choose design decisions for the grating-photo-transistor in Standard CMOS for Silicon ON Insulator (SOI) technology can be expressed as follows:

```
If d=0 {
    a. // Apply 1D or 2D grating
    b. // 1D grating, if design rules do not allow a transistor with a gate in
       two dimensions
    c. // 2D grating, if design rules allow a transistor with a gate in two
       dimensions
    d. if 2D grating {
        1. if vertical grating { sy=0; sx!=0; }
        2. if horizontal grating { sx!=0; sy=0; }
    e. } else {
        1. if horizontal grating { sx=0; }
        2. if vertical grating { sy=0; }
    f. }
} else {
    g. // Apply 2D grating
    h. // 1D grating possible, but 2D grating more effective
    i. // without grating 6% absorption
    j. // with 1D grating 33% absorption
    k. // with 2D grating 66% absorption
    l. if grating is metal {
        1. // design goal: maximum intensity of diffraction orders in
           transistor gates
        2. // minimize reflection at metal layer
        3. // minimize absorption in grating layer
        4. keep wx and wy as small as possible
        5. keep px and py as large as possible
        6. keep sx, sy as large as possible
        7. optimize px, py, wx, wy, sx, sy in order to maximize the
           irradiance in the gate region
    m. } else {
        1. // grating is a transparent material like glass
        2. // design goal: maximum intensity of diffraction orders in
           transistor gates
        3. // minimize absorption in grating layer
        4. // px, py, wx, wy, sx, sy are decoupled from the
           transistor design
        5. optimize px, py, wx, wy, sx, sy in order to maximize the
           irradiance in the gate region
    n. }
}
```

Comments on the Algorithm:
The grating layers can be made of SiNi, another glass like material, or a metal in a CMOS SOI technology. If metal is used, the design space is limited by the high reflectance and absorption of the metal. If SiNi or another glass-like material is used, the reflectance and absorption is low and hence the design space is much larger.

In CMOS SOI technology, the grating may be directly attached to the channel of the transistor for d=0 and the gate-material is used to build the grating.

If the grating is made of polysilicon, then the polysilicon may be used to build the gate of a transistor and the grating pattern. In conventional CMOS SOI technologies, the design rules permit the design of gates in one dimension. However, it is also possible to build transistors with gates in two dimensions.

Figure 7A:
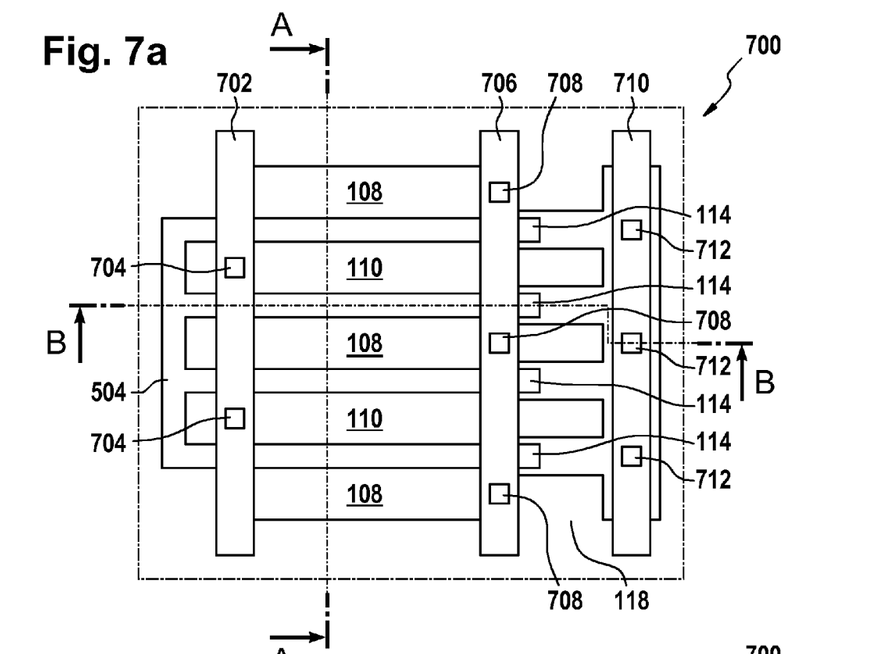
FIG. 7a shows a top view of a photo detector 700 according to an embodiment of the invention which has a bias for the gate region of a field effect transistor.
Figure 7B:
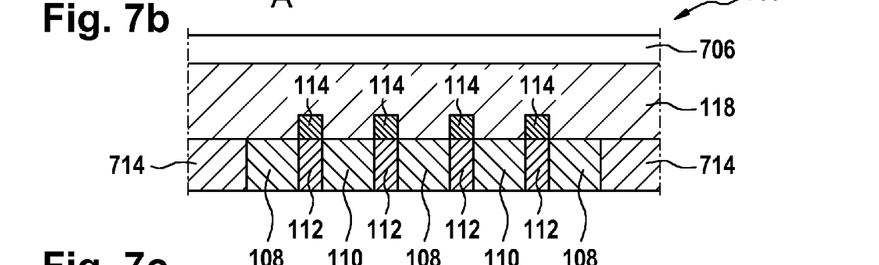
FIG. 7b shows a cross sectional view of the photo detector embodiment shown in FIG. 7a, FIG. 7c shows a further cross sectional view of the photo detector embodiment shown in FIG. 7a, FIG. 8 shows schematic diagram of a circuit formed on an integrated circuit according to an embodiment of the invention.
Figure 7C:
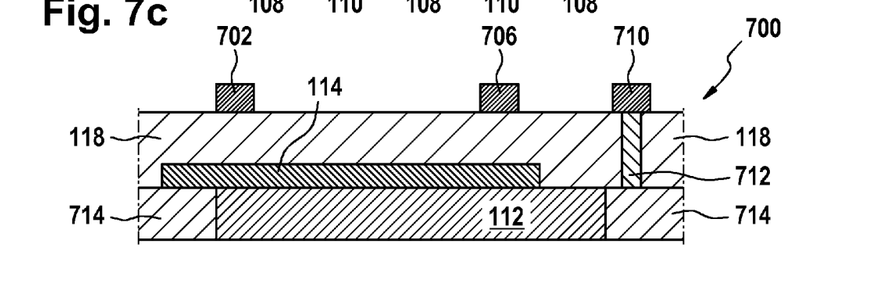

FIG. 7a shows a top view of a photo detector 700 according to an embodiment of the invention. In the embodiment illustrated in FIG. 7a there is a cross-sectional view AA which is illustrated in FIG. 7b and there is a second cross-sectional view labeled BB which is shown in FIG. 7c. In this embodiment the gate contact 114 functions as the grating pattern. There is a dielectric layer 118 which covers the entire device. The first wells 108 are connected by a bus 706. Individual vias 708 form the electrical connection between the bus 706 and each of the wells 108. Vias 704 connect the electrical bus 702 to the second wells 110. In this embodiment there is an electrical bus 710 with vias 712 that reach and form electrical connection to the gate region 112. By applying a voltage to the bus 710 a voltage may be applied to the gate region 112 of each of the photodiode. There is insulating oxide 714 which is used to electrically isolate the silicon channel.

Figure 8:
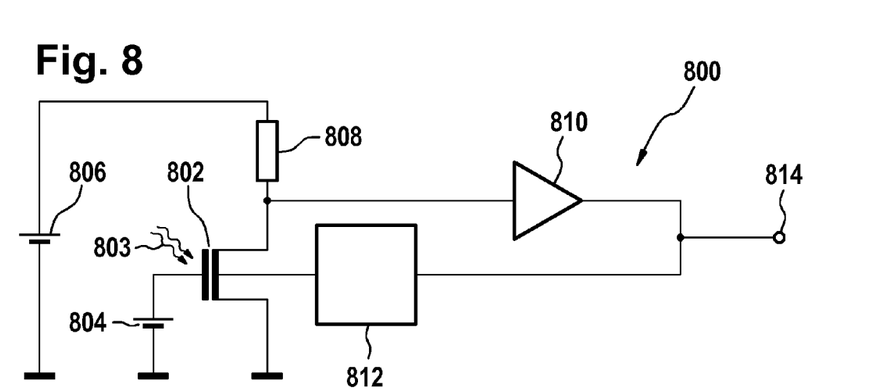

FIG. 8 shows an example of a circuit 800 formed on an integrated circuit according to an embodiment of the invention. There is a field effect transistor photo transistor 802, shown is as a drain bias voltage supply 806. The field effect photo transistor is controlled using light 803. The drain bias 806 is connected to a resistor 808. The other end of the resistor 808 is connected to the drain of the transistor 802 and also to an amplifier 810. There is a gate bias 804 voltage supply which is connected to the gate of the transistor 802. The source of the transistor 802 is connected to ground. There is a bulk bias generator 812 which is connected electrically to the gate region of the transistor (region of the channel below the gate) 802. The other end of the gate bias generator is connected to the output of the amplifier 810. The output of the amplifier is also the signal out 814 of the circuit. The bulk bias generator 812 generates a voltage which is used to remove charges from the gate region during operation more rapidly than would occur if they disappeared through recombination. This allows the transistor 802 to switch more rapidly.

The bulk bias generator 812 may be operated in a variety of ways. It may have a constant bias or may be modulated by an amplified detected signal as is shown in this Fig. This speeds up removal of optically generated carriers such as holes or electrons.

Figure 9:
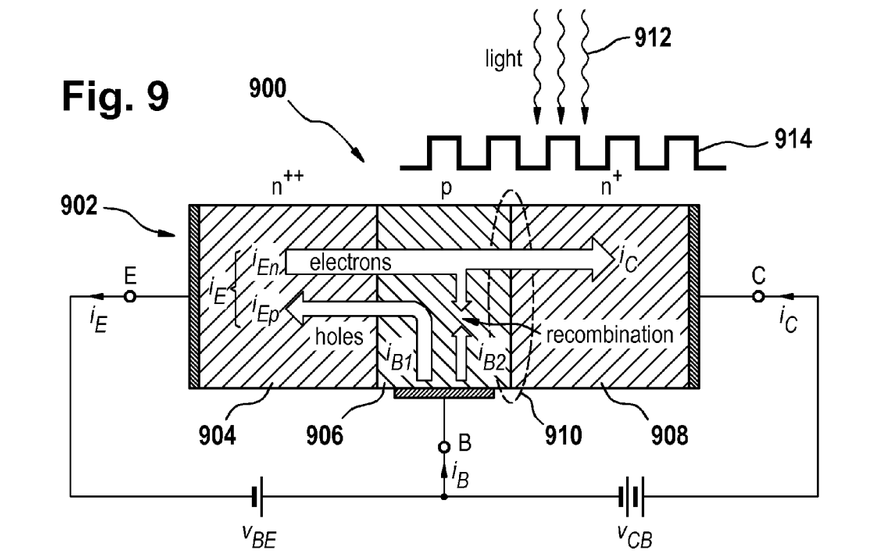
FIG. 9 illustrates a photo detector according to a further embodiment of the invention.

FIG. 9 shows a photo detector 900 according to an embodiment of the invention. In this embodiment a bipolar photo transistor 902 is used. The photo transistor 902 has an emitter 904, a base 906, and a collector 908. Between the base 906 and the collector 908 there is a PN junction 910. Light 912 is focused into the PN junction 910 by a grating pattern 914. The grating pattern 914 would be located near the photo transistor 902 between the path of the light 912 to the PN junction 910. In this embodiment the grating pattern is shown as being a square tooth pattern. Other patterns such as the teeth being replaced with semicircles or with a saw tooth pattern may also be applicable.

Figure 10:
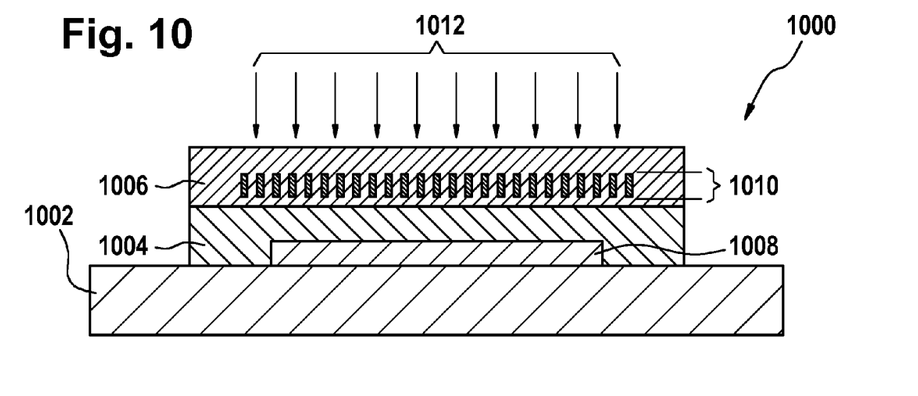
FIG. 10 illustrates an embodiment of an integrated circuit according to the invention.

FIG. 10 shows an embodiment of a integrated circuit 1000 according to the invention. The integrated circuit comprises a semiconductor wafer 1002. There is a first level 1004 of circuitry on the semiconductor wafer. There is a second level 1006 of circuitry above the first level 1004 of circuitry. There may be electrical vias which connect circuitry of the first 1004 and second 1006 levels. Within the first level 1004 there is a collection of photo detectors 1008. Within the second level 1006 there is a grating pattern 1010. The grating patter could either be a grating pattern that is located in the second level or the grating pattern could be formed by circuitry located in the second level. Light 1012 passes through the grating pattern 1010. The grating pattern 1010 concentrates electromagnetic radiation in the light sensitive regions of the photo detectors 1008.

What is claimed is:

1. An integrated circuit, comprising:
   at least a substrate, a second level and a first level intermediate the substrate and the second level, wherein the integrated circuit includes a photo detector including:
   a photo transistor including first and second terminals and a light sensitive region in the first level that controls switching of the photo transistor, wherein the first and second terminals are formed respectively by first and second wells having a common doping type and the light sensitive region has an opposite doping type from the first and second wells, and wherein the light sensitive region is one of a set including a gate and a base-collector PN junction;
   a dielectric layer in contact with the photo transistor; and
   a grating pattern in contact with the dielectric layer, wherein the grating pattern and the dielectric layer are configured to focus electromagnetic radiation in the light sensitive region, wherein the second level comprises electrical circuitry that forms at least a portion of the grating pattern.

2. The integrated circuit of claim 1, wherein:
   the grating pattern comprises a sub-wavelength grating; and
   the sub-wavelength grating is configured to form standing electromagnetic waves focused on the light sensitive region.

3. The integrated circuit of claim 1, wherein:
   the photo detector further comprises a light guide; and
   the grating pattern and the dielectric layer are configured to focus electromagnetic radiation transmitted by the light guide in the light sensitive region.

4. The integrated circuit of claim 1, wherein:
   the photo transistor includes a silicon channel having a first dielectric constant; and
   the photo detector further comprises a substrate having a second dielectric constant that is less than the first dielectric constant.

5. The integrated circuit of claim 1, wherein:
   the dielectric layer has a third dielectric constant; and
   the grating pattern comprises a dielectric having a fourth dielectric constant different than the third dielectric constant.

6. The integrated circuit of claim 1, wherein the grating pattern comprises metal.

7. The integrated circuit of claim 1, wherein:
   the photo transistor is a field effect transistor having a gate; and
   the light sensitive region of the photo transistor is the gate.

8. The integrated circuit of claim 7, wherein:
   the gate has an electrode; and
   the grating pattern forms at least a portion of the electrode.

9. The integrated circuit of claim 8, wherein:
   the gate comprises multiple discrete gate regions;
   the photo transistor includes a source comprising multiple discrete source regions, wherein the multiple discrete source regions include the first well;
   the photo transistor includes a drain region comprising multiple discrete drain regions, wherein the multiple discrete drain regions include the second well; and
   the multiple gate regions, the multiple source regions, and the multiple drain regions are configured in a comb-like structure.

10. The integrated circuit of claim 8, wherein:
    the field effect transistor further includes a gate oxide between the electrode and the light sensitive region; and
    the gate oxide does not overlay the first and second wells.

11. The integrated circuit of claim 7, wherein the field effect transistor comprises an electrical connection configured to apply a bias to the gate region.

12. The integrated circuit of claim 11, wherein:
    the integrated circuit includes a plurality of photo detectors including the photo detector;
    the integrated circuit comprises a bias circuit connected an electrical connection of each of the plurality of photo detectors; and
    the bias circuit is configured to generate a bias to remove optically generated charge carriers in the gate region.

13. The integrated circuit of claim 1, wherein:
    the photo transistor is a bipolar photo transistor having a collector and a base;
    the bipolar photo transistor has a PN junction between the collector and the base; and
    the PN junction is the light sensitive region of the bipolar photo transistor.

14. The integrated circuit of claim 1, wherein the integrated circuit comprises a plurality of photo detectors including the photo detector.

15. The integrated circuit of claim 14, wherein the plurality of photo detectors is configured as one of a set including an optical communication device for communicating optically with another integrated circuit, a polarization detector, a spectrometer, a small-band photo filter the performs wavelength-dependent detection of incident light, and polarization detector that performs polarization-dependent detection of incident light.

16. The integrated circuit of claim 1, and further comprising a buried insulator underlying the photo transistor.

17. An integrated circuit, comprising:
    at least a substrate, a second level and a first level intermediate the substrate and the second level, wherein the integrated circuit includes a photo detector including:
    a photo transistor, wherein the photo transistor is a field effect transistor having a source, a drain and a gate, wherein the gate is a light sensitive region in the first level that controls switching of the photo transistor, wherein the source and drain are formed respectively by first and second wells having a common doping type and the gate has an opposite doping type from the first and second wells;
    a dielectric layer in contact with the photo transistor; and
    a grating pattern in contact with the dielectric layer, wherein the grating pattern and the dielectric layer are configured to focus electromagnetic radiation in the light sensitive region, wherein the second level comprises electrical circuitry that forms at least a portion of the grating pattern.

18. The integrated circuit of claim 17, wherein:
    the gate has an electrode; and
    the grating pattern forms at least a portion of the electrode.

19. The integrated circuit of claim 18, wherein:
    the field effect transistor further includes a gate oxide between the gate and the electrode; and
    the gate oxide does not overlay the first and second wells.

20. The integrated circuit of claim 17, wherein:
    the source includes multiple discrete source regions, wherein the multiple discrete source regions include the first well;

the drain includes multiple discrete drain regions, wherein the multiple discrete drain regions include the second well;

the gate comprises multiple discrete gate regions;

the multiple gate regions, the multiple source regions, and the multiple drain regions are configured to form a comb-like structure.

21. The integrated circuit of claim 17, and further comprising an electrical connection configured to apply a bias to the gate.

22. The integrated circuit of claim 17, wherein:

the grating pattern comprises a sub-wavelength grating; and the sub-wavelength grating is configured to form standing electromagnetic waves focused on the light sensitive region.

23. The integrated circuit of claim 17, wherein:

the photo detector further comprises a light guide; and the grating pattern and the dielectric layer are configured to focus electromagnetic radiation transmitted by the light guide in the light sensitive region.

24. The integrated circuit of claim 17, wherein:

the photo transistor includes a channel having a first dielectric constant; and the photo detector further comprises a substrate having a second dielectric constant that is less than the first dielectric constant.

25. The integrated circuit of claim 17, wherein:

the dielectric layer has a third dielectric constant; and the grating pattern comprises a dielectric having a fourth dielectric constant different than the third dielectric constant.

26. The integrated circuit of claim 17, wherein the grating pattern comprises metal.

* * * * *